(12) United States Patent
Chung et al.

(10) Patent No.: US 12,514,001 B2
(45) Date of Patent: Dec. 30, 2025

(54) SYNAPTIC DEVICE AND ITS MANUFACTURING METHOD

(71) Applicant: Electronics and Telecommunications Research Institute, Daejeon (KR)

(72) Inventors: Yong-Duck Chung, Daejeon (KR); Woo Jung Lee, Daejeon (KR); Daehyung Cho, Daejeon (KR); Taeha Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 445 days.

(21) Appl. No.: 18/081,311

(22) Filed: Dec. 14, 2022

(65) Prior Publication Data

US 2023/0361228 A1 Nov. 9, 2023

(30) Foreign Application Priority Data

May 3, 2022 (KR) ........................ 10-2022-0054776

(51) Int. Cl.
| | | |
|---|---|---|
| *H10F 10/16* | (2025.01) | |
| *H10F 30/222* | (2025.01) | |
| *H10F 71/00* | (2025.01) | |
| *H10F 77/12* | (2025.01) | |
| *H10F 77/123* | (2025.01) | |
| *H10F 77/30* | (2025.01) | |

(52) U.S. Cl.
CPC ........... *H10F 10/16* (2025.01); *H10F 30/222* (2025.01); *H10F 71/00* (2025.01); *H10F 77/123* (2025.01); *H10F 77/126* (2025.01); *H10F 77/306* (2025.01)

(58) Field of Classification Search
CPC ...... H10F 10/16; H10F 30/222; H10F 77/126; H10F 77/1699
See application file for complete search history.

(56) References Cited

U.S. PATENT DOCUMENTS

2003/0003614 A1* 1/2003 Andriessen .......... H10H 20/013
 438/22
2012/0285523 A1* 11/2012 Negami ................. H10F 10/17
 136/255

(Continued)

FOREIGN PATENT DOCUMENTS

| CN | 111312899 | 6/2020 |
|---|---|---|
| CN | 112436092 | 3/2021 |

(Continued)

OTHER PUBLICATIONS

Xu et al., "Organometal Halide Perovskite Artificial Synapses", Advanced Materials, 2016, pp. 5916-5922, vol. 28.

*Primary Examiner* — Matthew L Reames
(74) *Attorney, Agent, or Firm* — KILE PARK REED & HOUTTEMAN PLLC

(57) ABSTRACT

Provided is a method of manufacturing a synaptic device. The method includes forming a first electrode, forming a synaptic mimic layer including a hole transport layer and an electron transport layer on the first electrode, and forming a second electrode on the synaptic mimic layer, wherein the forming of the synaptic mimic layer includes forming the electron transport layer on the hole transport layer through a solution process.

11 Claims, 9 Drawing Sheets

(56) References Cited

U.S. PATENT DOCUMENTS

2014/0238479 A1    8/2014  Lim et al.
2014/0299189 A1  10/2014  Lim et al.
2023/0209860 A1*  6/2023  Jung ...................... C09K 11/64
                                                                  257/40

FOREIGN PATENT DOCUMENTS

| KR | 10-2015-0136722 | 12/2015 |
| KR | 10-2017-0094619 | 8/2017 |
| KR | 10-2019-0116820 | 10/2019 |
| KR | 10-2262616 | 6/2021 |
| KR | 10-2022-0050559 | 4/2022 |

* cited by examiner

SYNAPTIC DEVICE AND ITS MANUFACTURING METHOD

CROSS-REFERENCE TO RELATED APPLICATIONS

This U.S. non-provisional patent application claims priority under 35 U.S.C. § 119 of Korean Patent Application No. 10-2022-0054776, filed on May 3, 2022, the entire contents of which are hereby incorporated by reference.

BACKGROUND

The present disclosure herein relates to a synaptic device and a manufacturing method thereof, and more particularly, to a synaptic device using a nonlinear photoelectric device and a manufacturing method thereof.

The human brain is a very efficient and powerful biological computer capable of processing a large amount of information efficiently and quickly using a parallel structure of about 100 billion neurons and about 100 trillion synapses connecting between the neurons in all directions. When seeing, hearing, feeling, or thinking about something, neurons convert it into a spike that is an electric signal having short duration so as to exchange information with other neurons. A synapse is a link of information exchange between neurons, and during a transmission process therebetween, the ion distribution of the synapse and the concentration of receptors which capture signal transmitters such as dopamine, serotonin, and the like change, and learning and memorizing are performed simultaneously. In order to implement a neuromorphic system, researches are actively carried out to develop a spiking neural network (SNN)-based artificial neural network that effectively mimics a biological neural network in terms of excellent parallel computation capability for recognition and inference and energy efficiency. A neuromorphic system for an SNN includes a synaptic device and a neuron circuit, and is required to have a highly integrated synaptic array, ultra-low power operation, and high recognition accuracy.

SUMMARY

The present disclosure provides a synaptic device using a nonlinear photoelectric device and a manufacturing method thereof.

The purposes of the present disclosure are not limited to the above-mentioned purposes, and other purposes not mentioned would be clearly understood by those skilled in the art from the disclosure below.

An embodiment of the inventive concept provides a method of manufacturing a synaptic device, the method including forming a first electrode, forming a synaptic mimic layer including a hole transport layer and an electron transport layer on the first electrode, and forming a second electrode on the synaptic mimic layer, wherein the forming of the synaptic mimic layer includes forming the electron transport layer on the hole transport layer through a solution process.

In an embodiment, the forming of the electron transport layer through the solution process may include forming the electron transport layer by chemical bath deposition or spin coating using a solution containing hydroxide ions, a zinc precursor solution, and a sulfur precursor solution.

In an embodiment, the solution containing hydroxide ions may include at least one of NaOH, NH$_4$OH, or NH$_4$CH$_3$CO$_2$.

In an embodiment, the zinc precursor solution may include at least one of ZnSO$_4$·7H$_2$O, ZnSO$_4$, ZnCl$_2$, Zn(NO$_3$)$_2$, or (CH$_3$COO)$_2$Zn·2H$_2$O.

In an embodiment, the sulfur precursor solution may include at least one of thiourea, Na$_2$S$_2$O$_3$, Na$_2$S, or H$_2$S.

In an embodiment, the forming of the hole transport layer may include at least one of thermal evaporation, selenization, or co-evaporation.

In an embodiment, the forming of the hole transport layer may be performed using an effusion cell or precursor of Cu, In, Ga, and Se.

In an embodiment, the forming of the first electrode may include at least one of sputtering, pulsed laser deposition, thermal evaporation, molecular beam epitaxy, or chemical vapor deposition.

In an embodiment, the forming of the second electrode may include at least one of sputtering, pulsed laser deposition, thermal evaporation, molecular beam epitaxy, or chemical vapor deposition.

In an embodiment, the method may further include washing a substrate, wherein the forming of the first electrode may include forming the first electrode on the substrate.

In an embodiment, the method may further include forming an anti-reflective film on the second electrode.

In an embodiment of the inventive concept, a synaptic device for outputting current by converting light includes a first electrode, a synaptic mimic layer provided on the first electrode, and a second electrode provided on the synaptic mimic layer, wherein the synaptic mimic layer includes a hole transport layer and an electron transport layer, and the electron transport layer includes Zn, O, and S, and the hole transport layer includes Cu, In, and Ga.

In an embodiment, the hole transport layer may further includes Se or S.

In an embodiment, the first electrode may include at least one of Al, Cu, Ni, Fe, Cr, Ti, Zn, Pb, Au, Ag, Mo, FTO, ITO, AZO, BZO, or GIZO.

In an embodiment, the second electrode may include at least one of Al, Cu, Ni, Fe, Cr, Ti, Zn, Pb, Au, Ag, Mo, FTO, ITO, AZO, BZO, or GIZO.

In an embodiment, the synaptic device may further include a substrate and an anti-reflective film, wherein the first electrode may be provided on the substrate, and the anti-reflective film may be provided on the second electrode.

In an embodiment, the substrate may include at least one of soda lime glass, a ceramic substrate, stainless steel, a copper tape, or a polymer film.

In an embodiment, the anti-reflective film may include at least one of SiO$_2$, TiO$_2$, Al$_2$O$_3$, MgF$_2$, ZnS, Ta$_2$O$_3$, or SiN$_x$.

In an embodiment, the first electrode may include at least one of Al, Cu, Ni, Fe, Cr, Ti, Zn, Pb, Au, Mo, or Ag, and the second electrode may include at least one of FTO, ITO, AZO, BZO, or GIZO.

In an embodiment, the synaptic device may have a paired pulse facilitation (PPF) value, defined by the current, of about 1.3 to about 1.0.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Hereinafter, embodiments of the inventive concept will be described with reference to the accompanying drawings so that the configuration and effects of the inventive concept are sufficiently understood. However, the inventive concept is not limited to the embodiments described below, but may be implemented in various forms and may allow various changes and modifications. Rather, the embodiments are provided so that this disclosure will be thorough and complete, and will fully convey the scope of the inventive concept to those skilled in the art. In the accompanying drawings, the dimensions of elements are magnified for convenience, and the scale ratios among the elements may be exaggerated or reduced. Furthermore, the terms used to describe the embodiments of the inventive concept may be interpreted as the meanings known in the art unless the terms are defined differently.

For convenience, the upward direction of the drawings is referred to as being upward, and a face oriented in the upward direction of the drawings is referred to as an upper face. The downward direction of the drawings is referred to as being downward, and a face oriented in the downward direction of the drawings is referred to as a lower face. Furthermore, the direction from the left side to the right side of the drawings is referred to as a horizontal direction.

When a layer is referred to as being "on" another layer, it can be directly on the other layer, or intervening layers may also be present.

Hereinafter, embodiments of the inventive concept will be described in detail with reference to the accompanying drawings.

Figure 1A:
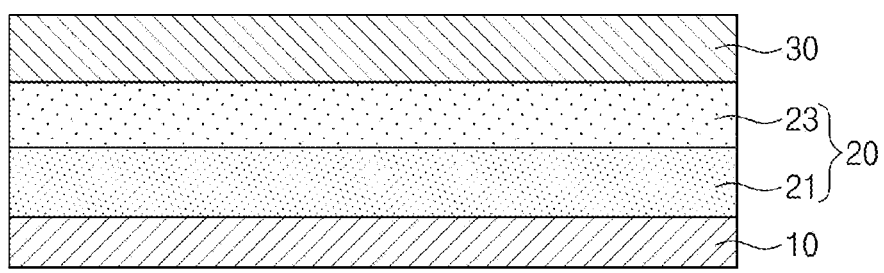
FIGS. 1A and 1B are cross-sectional views for describing a synaptic device according to embodiments of the inventive concept.
Figure 1B:
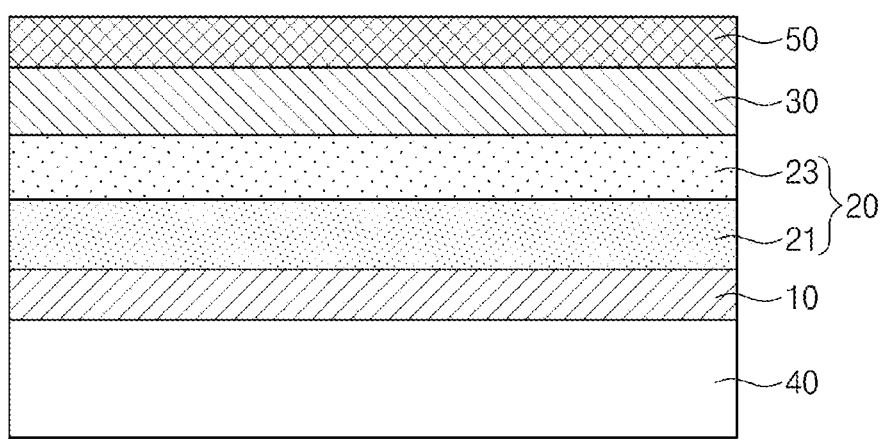

FIGS. 1A and 1B are cross-sectional views for describing a synaptic device according to embodiments of the inventive concept.

Referring to FIG. 1A, a synaptic device 1 according to an embodiment of the inventive concept may be provided. The synaptic device 1 may include a first electrode 10, a synaptic mimic layer 20, and a third electrode 30. The synaptic mimic layer 20 may include a hole transport layer 21 and an electron transport layer 23. The first electrode 10 may be formed by using a deposition method. The deposition method may include, for example, sputtering, pulsed laser deposition (PLD), thermal evaporation, molecular beam epitaxy (MBE), and/or chemical vapor deposition (CVD). The first electrode 10 may include, for example, at least one of a metal electrode such as Al, Cu, Ni, Fe, Cr, Ti, Zn, Pb, Au, Mo, or Ag or a transparent electrode such as fluorine-doped tin oxide (FTO), indium-tin oxide (ITO), aluminum-doped zinc oxide (AZO), boron-doped zinc oxide (BZO), or gallium indium zinc oxide (GIZO).

The hole transport layer 21 may be provided on the first electrode 10. The hole transport layer 21 may include, for example, $Cu(In,Ga)Se_2$ among p-type semiconductors. The hole transport layer 21 may include S instead of Se as necessary. The hole transport layer 21 may be formed by thermal evaporation, selenization after forming a precursor, or co-evaporation. Specifically, the selenization may include a two-step process including a precursor deposition process and a selenization process in which a heat treatment is performed. Precursors including Cu, In, and Ga may be sequentially vacuum deposited on the first electrode 10 through sputtering. Thereafter, the hole transport layer 21 may be formed by performing a selenization process at high temperature. Specifically, the co-evaporation may form the hole transport layer 21 using indium (In) effusion cell, copper (Cu) effusion cell, gallium (Ga) effusion cell, selenium (Se) effusion cell, and nitrogen (N) cracker. The indium effusion cell may include, for example, $In_2Se_3$. The copper effusion cell may include, for example, $Cu_2Se$. The gallium effusion cell may include, for example, $Ga_2Se_3$. The selenium effusion cell may include, for example, Se. The effusion cells may include, for example, a high-purity material with a purity of at least 99.99%.

The electron transport layer 23 may be provided on the hole transport layer 21. The electron transport layer 23 may include, for example, $Zn(O,S)$ among n-type semiconductors. The electron transport layer 23 may be formed through a solution process. The solution process may include, for example, chemical bath deposition or spin coating. In detail, the electron transport layer 23 may be formed using a solution containing hydroxide ions, a zinc precursor solution, and a sulfur precursor solution. The solution containing hydroxide ions may include, for example, a solution in which sodium hydroxide (NaOH), ammonium hydroxide ($NH_4OH$), and/or ammonium acetate ($NH_4CH_3CO_2$) is dissolved in a solvent. The zinc precursor solution may be formed by dissolving a zinc source and ammonium hydroxide ($NH_4OH$) in a solvent. The zinc source may include, for example, zinc sulfate hydrate ($ZnSo_4 \cdot 7H_2O$), zinc sulfate ($ZnSO_4$), zinc chloride ($ZnCl_2$), zinc nitrate ($Zn(NO_3)_2$), and/or zinc acetate hydrate (($CH_3COO)_2Zn \cdot 2H_2O$). The sulfur precursor solution may be formed by dissolving a sulfur source and ammonium hydroxide ($NH_4OH$) in a solvent. The sulfur source may include, for example, thiourea ($CH_4N_2S$), sodium thiosulfate ($Na_2S_2O_3$), sodium sulfide ($Na_2S$), and/or hydrogen sulfide ($H_2S$).

The second electrode 30 may be provided on the synaptic mimic layer 20. The second electrode 30 may be formed by using a deposition method. The deposition method may include, for example, sputtering, pulsed laser deposition (PLD), thermal evaporation, molecular beam epitaxy (MBE), and/or chemical vapor deposition (CVD). The second electrode 30 may include, for example, at least one of a metal electrode such as Al, Cu, Ni, Fe, Cr, Ti, Zn, Pb, Au, Mo, or Ag or a transparent electrode such as FTO, ITO, AZO, BZO, or GIZO.

Referring to FIG. 1B, the synaptic device 1 may further include a substrate 40 and an anti-reflective film 50. The first electrode 10 may be provided on the substrate 40. The substrate may include, for example, soda lime glass, a ceramic substrate such as alumina, stainless steel, a metal substrate such as a copper tape, or a polymer film. The anti-reflective film 50 may be provided on the second electrode 30. The anti-reflective film 50 may include, for example, silicon oxide ($SiO_2$), titanium oxide ($TiO_2$), $Al_2O_3$, $MgF_2$, ZnS, $Ta_2O_3$, or silicon nitride ($SiN_x$). In this case, the second electrode 30 may be, for example, a transparent electrode such as FTO, ITO, AZO, BZO, or GIZO.

Figure 2A:
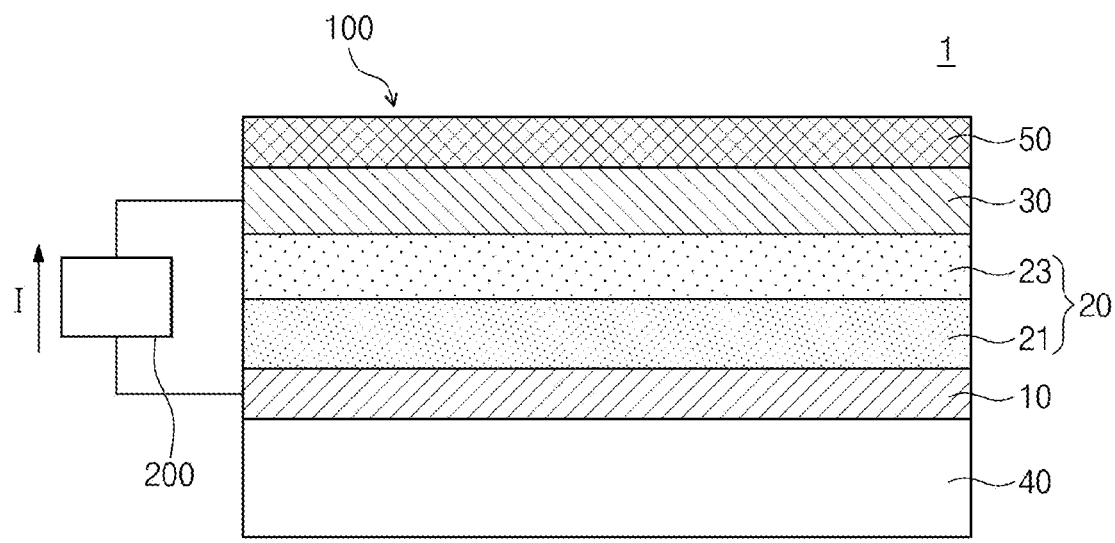
FIGS. 2A and 2B are diagrams for describing an operation principle of a synaptic device according to embodiments of the inventive concept.
Figure 2B:
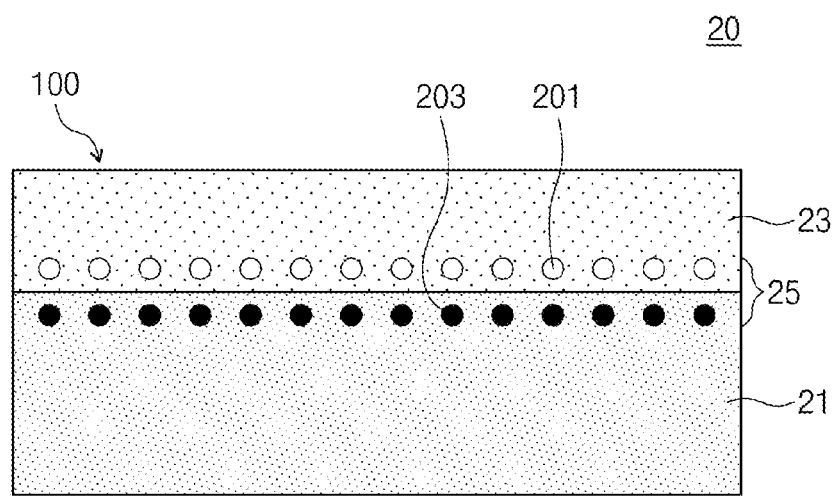

FIGS. 2A and 2B are diagrams for describing an operation principle of a synaptic device according to embodiments of the inventive concept.

Referring to FIG. 2A, the first electrode 10 and second electrode 30 of the synaptic device 1 may be connected through a measurement device 200. The measurement device 200 may include, for example, a device for measuring current. A current I may be generated when the synaptic device 1 is irradiated with light 100. The current I may include, for example, a photoelectric current. The light 100 may include, for example, solar light, laser, and/or ultraviolet (UV) light. The current I may flow from the first electrode 10 to the second electrode 30 via the measurement device 200. The measurement device 200 may measure an electric signal of the synaptic device 1. Therefore, the synaptic device 1 may operate similarly with synapses of nerve cells using the light 100 as an input signal and the current I as an output signal. The current I may be controlled by adjusting at least one of irradiation strength, irradiation time, or irradiation interval of the light 100 irradiating the synaptic device 1.

Referring to FIG. 2B, a depletion region 25 may be formed after elapse of a certain time after the hole transport layer 21 and the electron transport layer 23 are combined. The depletion region 25 may be formed in a bond surface between the hole transport layer 21 and the electron transport layer 23. The depletion region 25 may include holes 201 and electrons 203. When the synaptic mimic layer 20 is irradiated with the light 100, the electrons 203 may move to a side of the electron transport layer 23 in the depletion region 25 due to light energy. On the contrary, the holes 201 may move to a side of the hole transport layer 21 in the depletion region 25. The electrons 203 that have moved to the electron transport layer 23 may move to the measurement device 200 (see FIG. 2A) through the second electrode 30 (see FIG. 2A).

Figure 3:
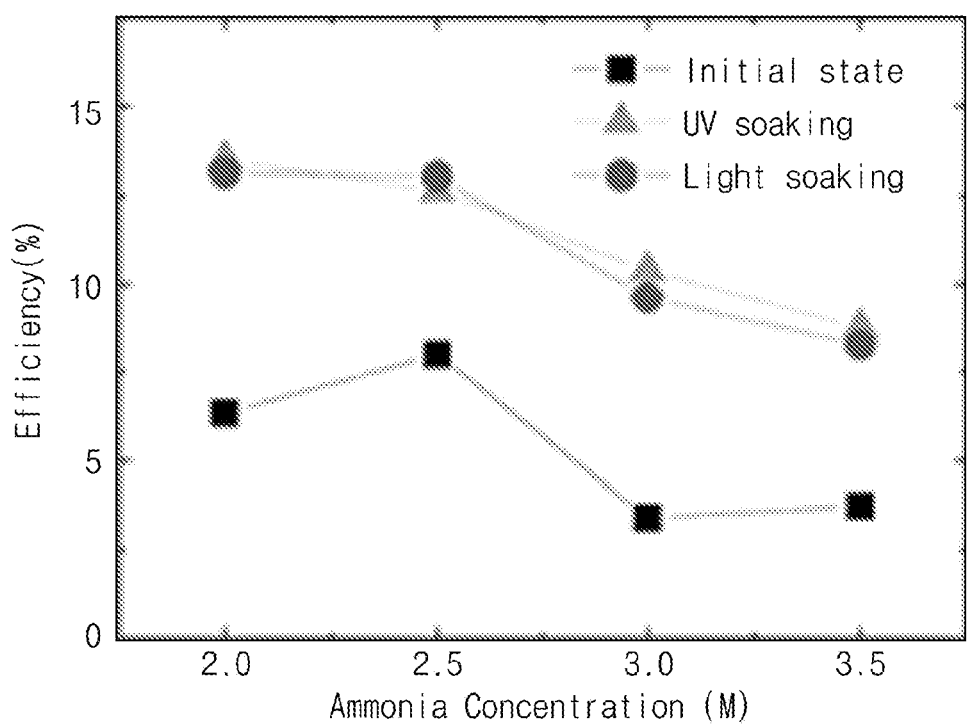
FIG. 3 is a graph illustrating a light soaking effect of a synaptic device according to embodiments of the inventive concept.

FIG. 3 is a graph illustrating a light soaking effect of a synaptic device according to embodiments of the inventive concept.

Referring to FIG. 3, when the synaptic device is irradiated with light for a certain period of time, concentration of excited photoelectrons may increase. This increase may be equivalent to an increase in power conversion efficiency (PCE) of a solar cell. That is, the light soaking effect may refer to a characteristic in which photoelectric conversion efficiency increases after radiating light for a certain time. In the case where the electron transport layer 23 includes Zn(O,S) formed by a chemical solution process, the power conversion efficiency may increase compared to an initial state according to ammonia concentration after light is radiated for a certain time. This indicates that the power conversion efficiency may increase in a UV region and all spectra of solar light. That is, the light soaking effect may be exhibited also in the solar light and UV region. The electron transport layer 23 may not be Zn(O,S) formed by a chemical solution process. In this case, although not illustrated in the drawings, initial power conversion efficiency may be similar but the light soaking effect may not be exhibited.

Figure 4:
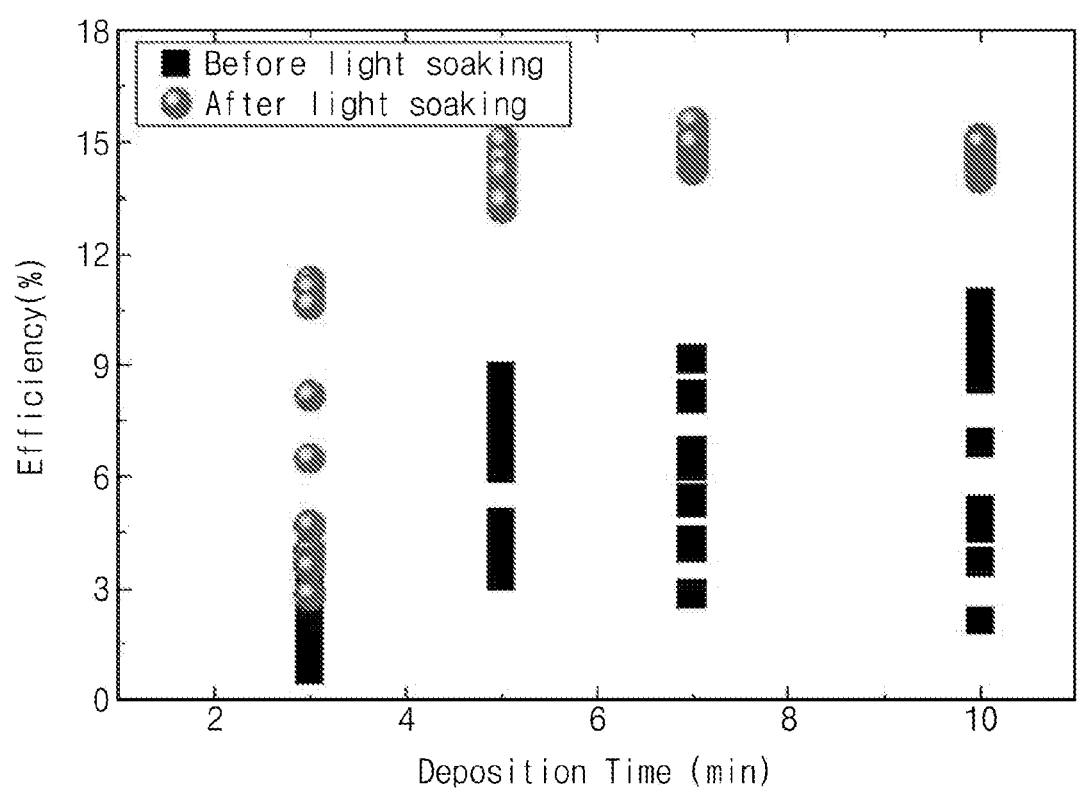
FIG. 4 is a graph illustrating photoelectric conversion efficiency of a synaptic device according to embodiments of the inventive concept.

FIG. 4 is a graph illustrating photoelectric conversion efficiency of a synaptic device according to embodiments of the inventive concept.

Referring to FIG. 4, the electron transport layer may be formed while changing a process time. The process time may be, for example, a time of spin coating using chemical bath deposition or continuous flow reactor (CFR). The process time may be, for example, about 3, 5, 7, or 10 minutes. As the process time increases, a maximum value of initial photoelectric conversion efficiency may increase. When the electron transport layer is irradiated with light for a certain time, the light soaking effect may be exhibited regardless of the process time. As the process time becomes shorter, a variation in the increasing photoelectric conversion efficiency due to the light soaking effect may increase.

Figure 5A:
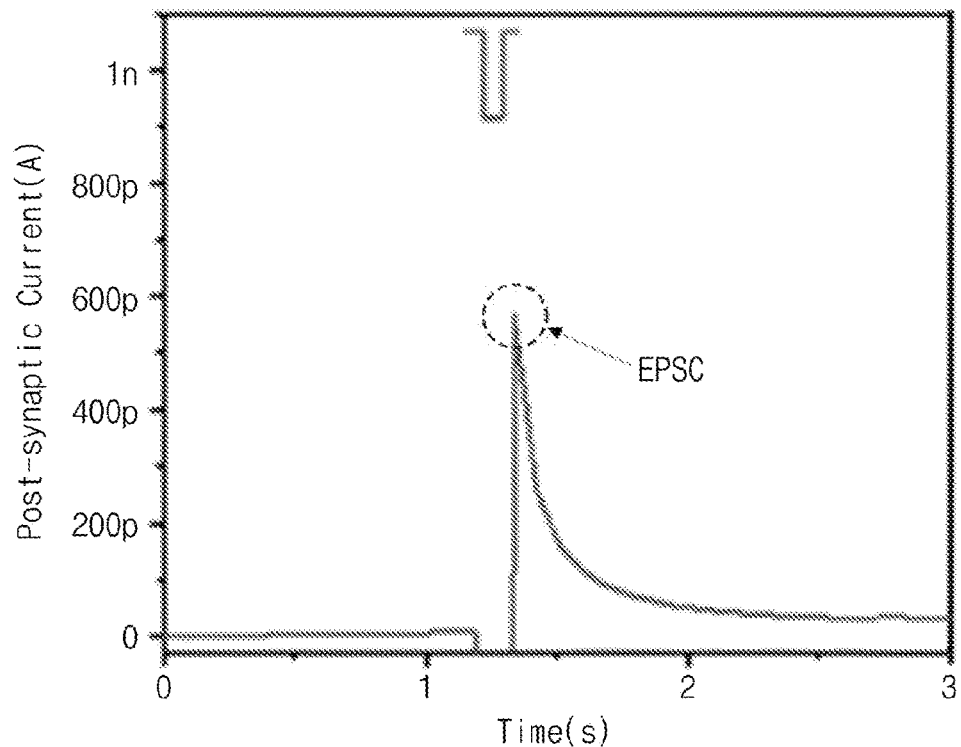
FIGS. 5A to 5C are graphs illustrating current characteristics of a synapse of a nerve cell and a synaptic device according to embodiments of the inventive concept.
Figure 5B:
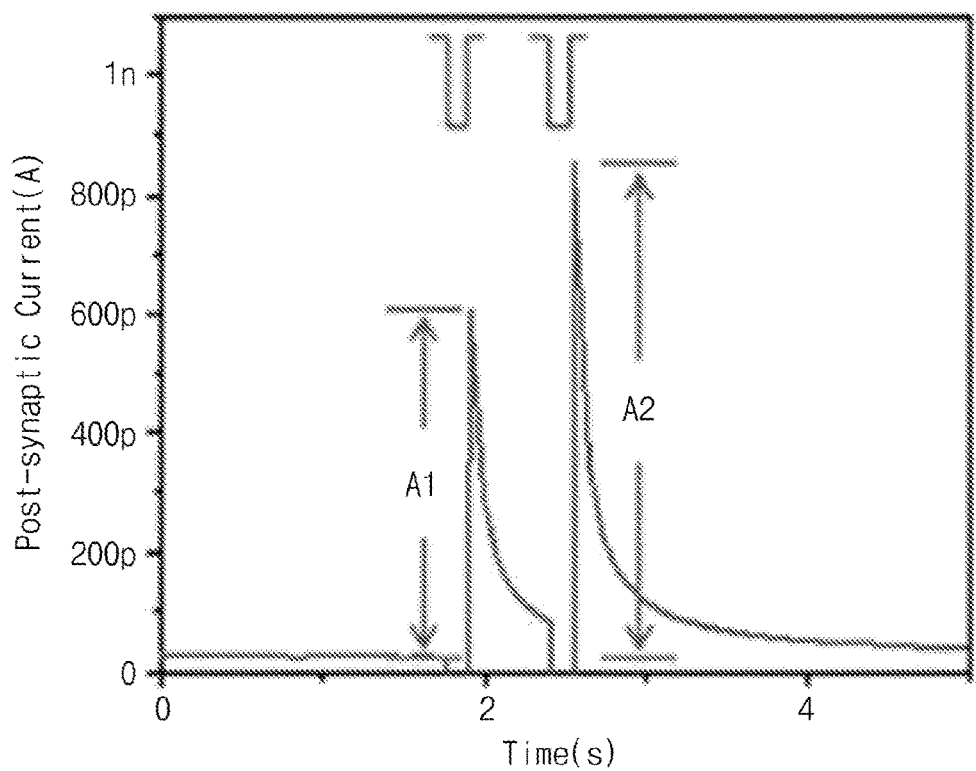
Figure 5C:
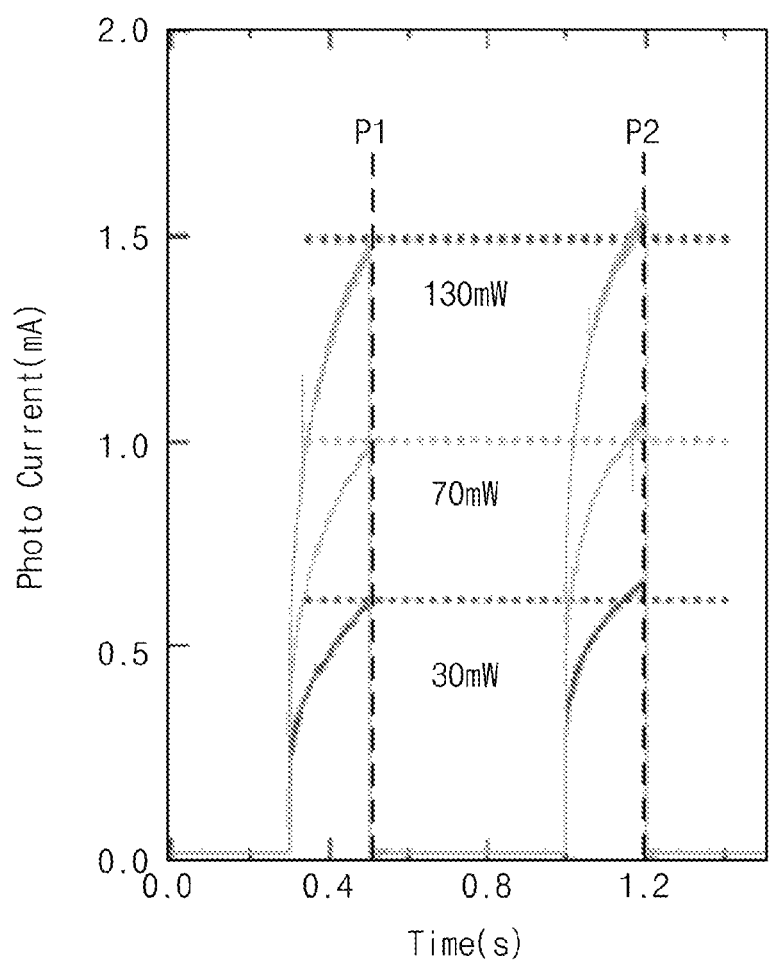

FIGS. 5A to 5C are graphs illustrating current characteristics of a synapse of a nerve cell and a synaptic device according to embodiments of the inventive concept.

Referring to FIG. 5A, in a synapse of a nerve cell, a spike signal may be applied to a presynaptic neuron, and thus a current in a postsynaptic neuron may instantaneously increase. The instantaneous increase of current in a postsynaptic neuron may be referred to as excitatory postsynaptic current (EPSC). After the excitatory postsynaptic current, the current in the postsynaptic neuron may gradually reduce. After elapse of a certain time, the current in the postsynaptic neuron may return to an initial value.

Referring to FIG. 5B, a first excitatory postsynaptic current may occur in the presynaptic neuron due to a first spike signal. Before the current in the postsynaptic neuron returns to the initial value, a second spike signal may be continuously applied to the presynaptic neuron. In this case, a second excitatory postsynaptic current may occur. A magnitude A2 of the second excitatory postsynaptic current may be larger than a magnitude A1 of the first excitatory postsynaptic current. When a spike signal is continuously applied to the presynaptic neuron, the excitatory postsynaptic current may increase, and this phenomenon may be referred to as paired pulse facilitation (PPF). A PPF value may satisfy the following equation.

$$PPF = \frac{A2}{A1}$$

That is, a synaptic weight may increase due to a continuous spike signal. Therefore, synapses of nerve cells may perform functions of learning, memorizing, and forgetting of a brain by generating the excitatory postsynaptic current.

Referring to FIG. 5C, a current may be generated by irradiating a synaptic device with a pulsed laser. A wavelength of the laser irradiating the synaptic device may be about 400 nm. When the synaptic device is irradiated with the pulsed laser, a current having a plurality of peaks may appear. Here, the laser may have the same role as action potential in a nerve cell. According to an embodiment of the inventive concept, when the synaptic device is irradiated with pulsed light, a photoelectric current may have a maximum value at about 0.5 seconds and about 1.2 seconds. In this case, the photoelectric current at about 0.5 seconds may be referred to as a first peak P1, and the photoelectric current at about 1.2 seconds may be referred to as a second peak. The first peak P1 may have the same role as the first excitatory postsynaptic current in a nerve cell. The second peak P2 may have the same role as the second excitatory postsynaptic current in a nerve cell. A magnitude of the first peak P1 may be smaller than a magnitude of the second peak P2. Therefore, the PPF value of the synaptic device may satisfy the following equation.

$$PPF = \frac{\text{Current magnitude at second peak } (P2)}{\text{Current magnitude at first peak } (P1)}$$

Power of laser for irradiating the synaptic device may be differently set. The power of laser for irradiating the synaptic device may be, for example, about 30 mW, 70 mW, or 130 mW. When the synaptic device is irradiated with laser, a photoelectric current may be generated due to a photoelectric effect. The photoelectric current due to the photoelectric effect may increase or decrease in proportion to the power of laser. Therefore, the photoelectric current may increase as the power of laser increases from about 30 mW to about 130 mW.

Figure 6:
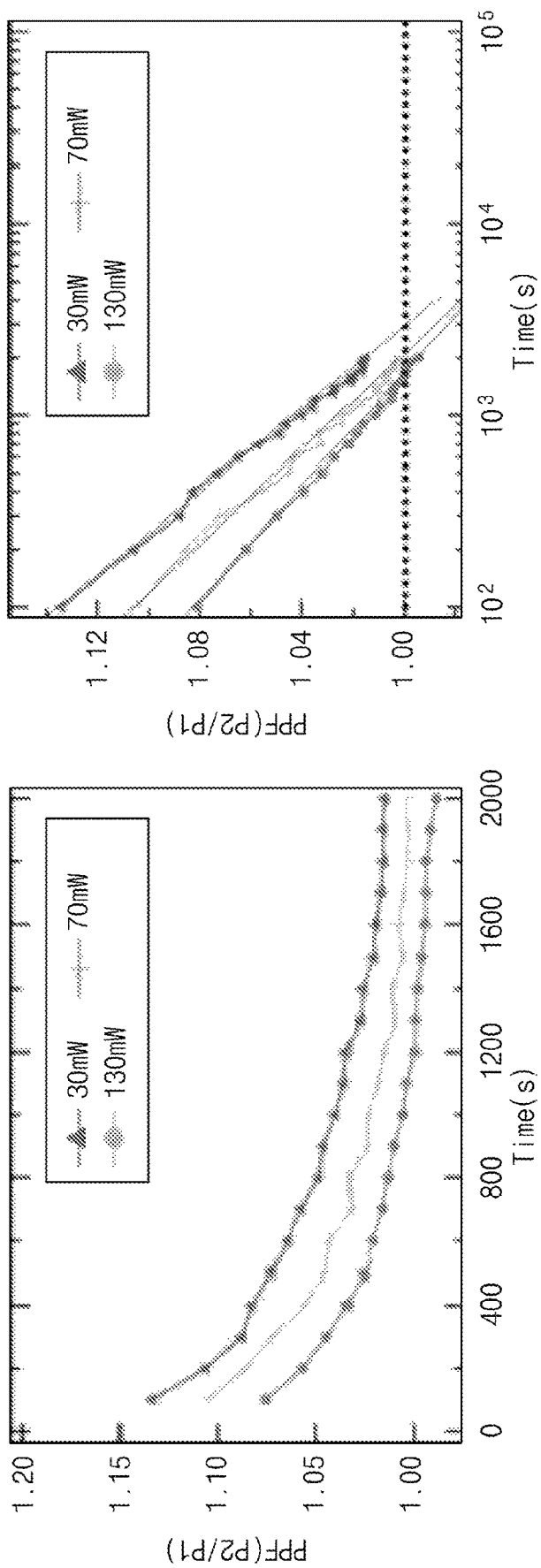
FIG. 6 shows graphs illustrating PPF characteristics of a synaptic device according to laser power according to embodiments of the inventive concept.

FIG. 6 shows graphs illustrating PPF characteristics of a synaptic device according to laser power according to embodiments of the inventive concept.

Referring to FIG. 6, the power of laser may be, for example, about 30 mW, 70 mW, or 130 mW. A wavelength of the laser irradiating the synaptic device may be about 400 nm. As a laser irradiation time increases, the PPF value may reduce regardless of the power of laser. When the power of laser is about 30 mW, the PPF value may reduce from about 1.14 to about 1.02 according to the laser irradiation time. When the power of laser is about 70 mW, the PPF value may reduce from about 1.10 to about 1.00 according to the laser irradiation time. When the power of laser is about 130 mW, the PPF value may reduce from about 1.08 to about 0.99 according to the laser irradiation time. An initial PPF value may be adjusted to from about 1.08 to about 1.14 by adjusting the power of laser irradiating the synaptic device.

Figure 7:
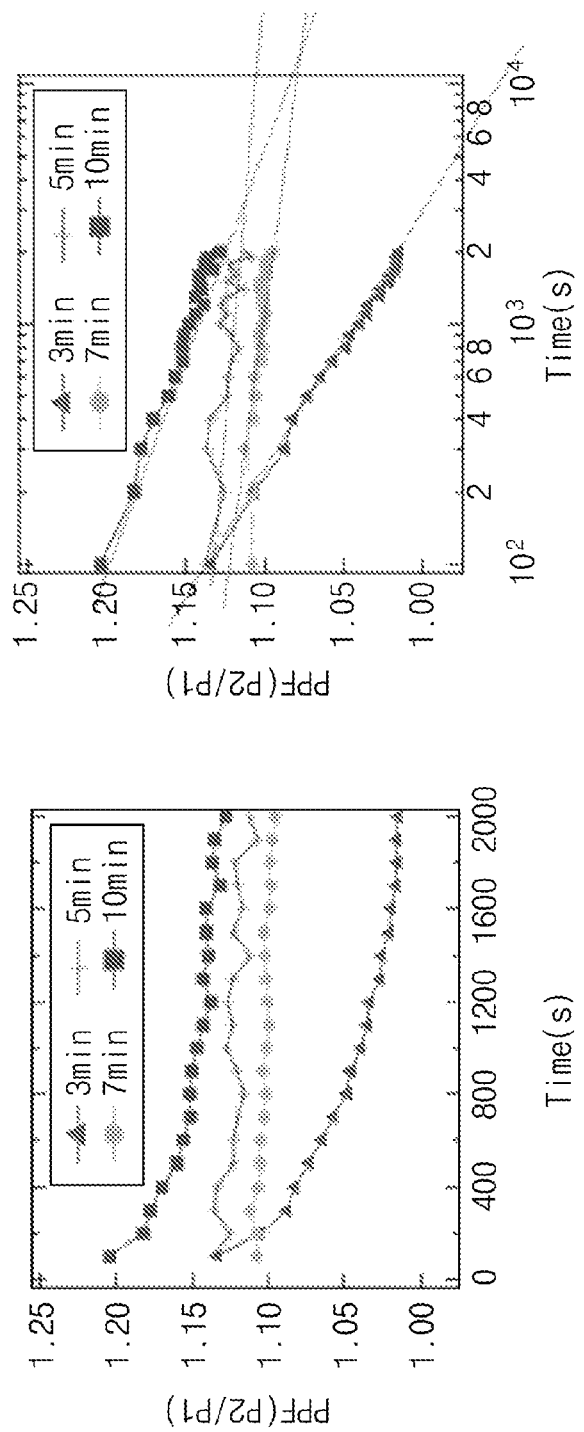
FIG. 7 shows graphs illustrating PPF characteristics of a synaptic device according to a process time according to embodiments of the inventive concept.

FIG. 7 shows graphs illustrating PPF characteristics of a synaptic device according to a process time according to embodiments of the inventive concept.

Referring to FIG. 7, the process time may be a process time for forming an electron transport layer. The process time may be, for example, about 3, 5, 7, or 10 minutes. The power of laser irradiating the synaptic device may be about 30 mW. As a laser irradiation time increases, the PPF value may reduce regardless of the process time. When the process time is about 3 minutes, the PPF value may reduce from about 1.14 to about 1.02 according to the laser irradiation time. When the process time is about 5 minutes, the PPF value may reduce from about 1.14 to about 1.12 according to the laser irradiation time. When the process time is about 7 minutes, the PPF value may reduce from about 1.11 to about 1.10 according to the laser irradiation time. When the process time is about 10 minutes, the PPF value may reduce from about 1.20 to about 1.14 according to the laser irradiation time. When the process time is about 3 minutes and about 10 minutes, the PPF value may sharply reduce at an initial stage. When the process time is about 5 minutes and about 7 minutes, the PPF value may regularly reduce regardless of time. When the time during which the synaptic device is irradiated with laser is expressed in powers of 10, reduction gradients of the PPF value when the process time is about 3 minutes and 10 minutes may be larger than reduction gradients of the PPF value when the process time is about 5 minutes and 7 minutes. The initial PPF value may be adjusted to from about 1.20 to about 1.11 by adjusting the process time of the synaptic device.

Figure 8:
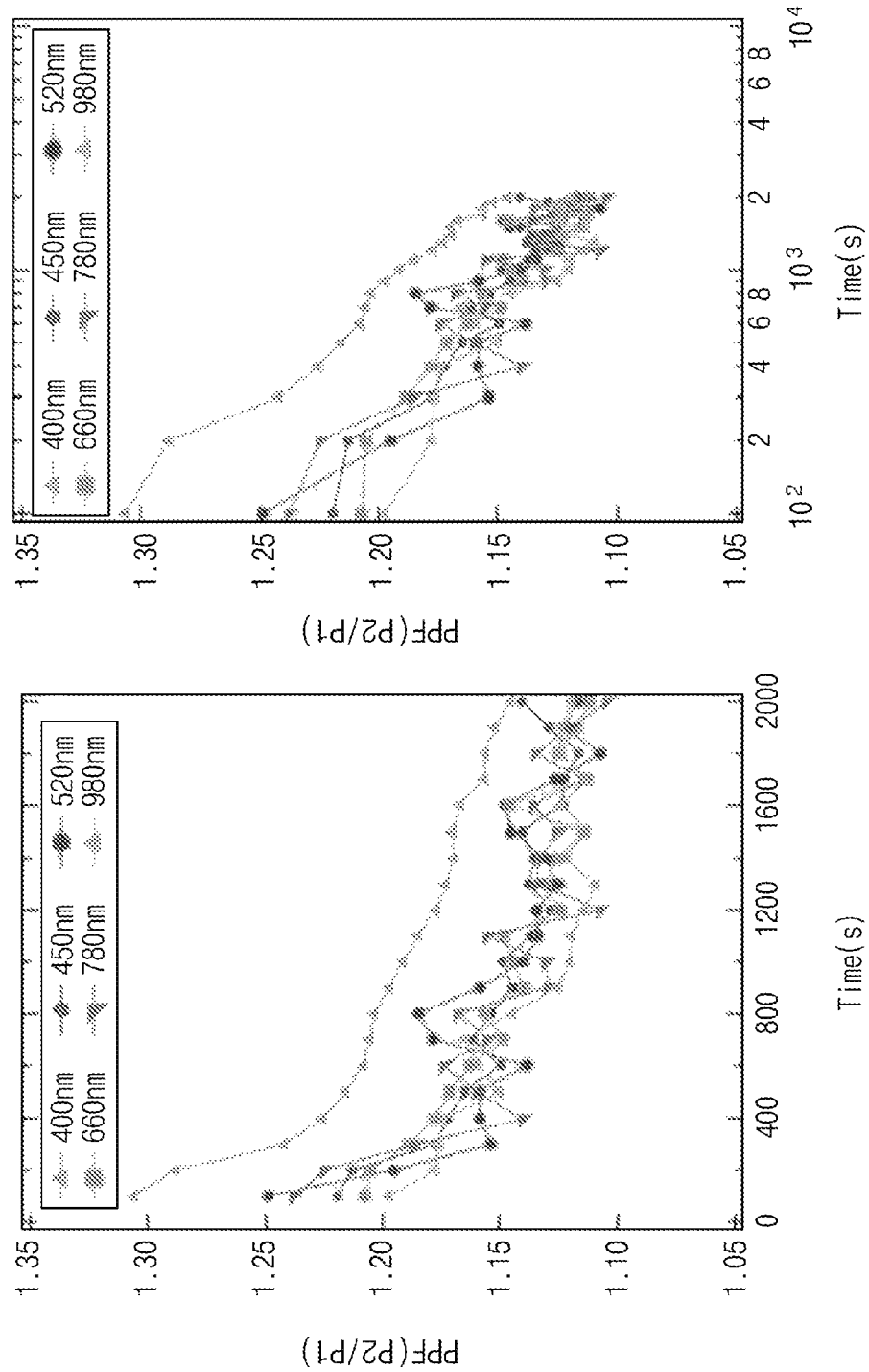
FIG. 8 shows graphs illustrating PPF characteristics of a synaptic device according to a laser wavelength according to embodiments of the inventive concept.

FIG. 8 shows graphs illustrating PPF characteristics of a synaptic device according to a laser wavelength according to embodiments of the inventive concept.

Referring to FIG. 8, the wavelength of laser may be, for example, about 400 nm, 450 nm, 520 nm, 660 nm, 780 nm, or 980 nm. The power of laser irradiating the synaptic device may be about 20 mW. As a laser irradiation time increases, the PPF value may reduce regardless of the wavelength of laser. When the wavelength of laser is about 400 nm, the PPF value may reduce from about 1.30 to about 1.15 according to the laser irradiation time. When the wavelength of laser is about 400 nm, 450 nm, 520 nm, 660 nm, and 780 nm, the PPF value may start at a value of about 1.25 to about 1.20 and decrease to a value of about 1.10 according to the laser irradiation time. The initial PPF value may be adjusted to from about 1.30 to about 1.20 by adjusting the wavelength of laser irradiating the synaptic device.

According to embodiments of the inventive concept, when a photoelectric material having excellent light absorption characteristics and a thin film manufactured by a wet process match, an electric signal may be achieved by radiating light. The PPF may be controlled by adjusting the wavelength, power, and time of irradiation light, and a synaptic device using this phenomenon may be manufactured.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method of manufacturing a synaptic device, the method comprising:
   forming a first electrode;
   forming a synaptic mimic layer; and
   forming a second electrode on the synaptic mimic layer,
   wherein the forming of the synaptic mimic layer includes:
      forming a hole transport layer on the first electrode;
      forming an electron transport layer on the hole transport layer through a solution process; and
      forming a depletion region in a bond surface between the hole transport layer and the electrode transport layer,
   wherein the electron transport layer includes Zn, O, and S, and the hole transport layer includes Cu, In, and Ga,
   wherein the depletion region includes holes and electrons, and
   wherein electrons of the depletion region are configured to move to the electron transport layer by light energy.

2. The method of claim 1, wherein the forming of the electron transport layer through the solution process includes forming the electron transport layer by chemical bath deposition or spin coating using a solution containing hydroxide ions, a zinc precursor solution, and a sulfur precursor solution.

3. The method of claim 2, wherein the solution containing hydroxide ions includes at least one of NaOH, $NH_4OH$, or $NH_4CH_3CO_2$.

4. The method of claim 2, wherein the zinc precursor solution includes at least one of $ZnSO_4 \cdot 7H_2O$, $ZnSO_4$, $ZnCl_2$, $Zn(NO_3)_2$, or $(CH_3COO)_2Zn \cdot 2H_2O$.

5. The method of claim 2, wherein the sulfur precursor solution includes at least one of thiourea, $Na_2S_2O_3$, $Na_2S$, or $H_2S$.

6. The method of claim 1, wherein the forming of the hole transport layer includes at least one of thermal evaporation, selenization, or co-evaporation.

7. The method of claim 6, wherein the forming of the hole transport layer is performed using an effusion cell or precursor of Cu, In, Ga, and Se.

8. The method of claim 1, wherein the forming of the first electrode includes at least one of sputtering, pulsed laser deposition, thermal evaporation, molecular beam epitaxy, or chemical vapor deposition.

9. The method of claim 1, wherein the forming of the second electrode includes at least one of sputtering, pulsed laser deposition, thermal evaporation, molecular beam epitaxy, or chemical vapor deposition.

10. The method of claim 1, further comprising:
    washing a substrate, wherein
    the forming of the first electrode includes forming the first electrode on the substrate.

11. The method of claim 1, further comprising forming an anti-reflective film on the second electrode.

* * * * *